United States Patent [19]

Andeen et al.

[11] Patent Number: 4,772,844
[45] Date of Patent: Sep. 20, 1988

[54] HIGH PRECISION CAPACITANCE BRIDGE

[75] Inventors: Carl G. Andeen, Euclid; Carl W. Hagerling, Chagrin Falls, both of Ohio

[73] Assignee: Andeen-Hagerling, Inc., Chagrin Falls, Ohio

[21] Appl. No.: 782,484

[22] Filed: Oct. 1, 1985

[51] Int. Cl.⁴ ............................................ G01R 27/26
[52] U.S. Cl. ................. 324/57 R; 324/60 C; 324/DIG. 1
[58] Field of Search ............... 324/57 R, 60 R, 60 C, 324/61, 62, DIG. 1, 98, 99 R; 364/550, 571

[56] References Cited

U.S. PATENT DOCUMENTS 3,473,117 10/1969 Ito ..................................... 324/57 R
3,562,641 2/1971 Fulks ................................. 324/57 R

OTHER PUBLICATIONS

Cutkosky, An Automatic High-Precision Audiofrequency Capacitance Bridge, IEEE Transactions on Instrumentation and Measurement, vol. IM-34, No. 3, Sep. 1985, pp. 383-389.

Primary Examiner—Reinhard I. Eisenzopf
Assistant Examiner—Jack B. Harvey
Attorney, Agent, or Firm—D. Peter Hochberg; Mark M. Kusner; Walter C. Danison, Jr.

[57] ABSTRACT

A capacitance measuring device and method including a ratio transformer, a reference capacitor(s), and multiplying digital to analog converters connected to form a bridge, the converter being adjustable to at least partially balance the bridge. The bridge can further include a 90° phase shifter and reference capacitors to balance the real part of the unknown impedance. An internal calibration scheme calibrates various components of the bridge.

32 Claims, 6 Drawing Sheets

HIGH PRECISION CAPACITANCE BRIDGE

BACKGROUND OF THE INVENTION

This invention relates to the measurement of electrical impedance, and in particular to the measurement of the loss and the very precise measurement of the capacitance of an unknown impedance where "loss" is used as a collective term to mean resistance, conductance, dissipation factor or any other term used to describe the real component of impedance.

The technical literature is replete with numerous examples of impedance bridges of all kinds. Bridges have been in a state of continuous development and improvement for more than a century. Improvements have taken almost every conceivable form, in efforts to achieve higher accuracy, lower cost, better reliability, higher speed, wider range, etc. More recently, most high performance bridges have been automated with the incorporation of microprocessors or related devices to allow these bridges not only to correct for various measurement errors, but to report their measurement results on sophisticated local displays or remotely via several different kinds of communication channels. Sufficient programming control is often provided to allow for sustained unattended operation.

In spite of the considerable attention given to impedance bridges in general, not all areas of bridge development have benefited from new ideas, particularly in the application of microprocessors. One such area is the construction of ratio transformer bridges for high precision measurements of capacitance and loss. Commercially, the state of the art is represented by the GenRad (formerly the General Radio Co.) Model 1615A Capacitance bridge. A similar, slightly higher precision capacitance bridge was the GenRad Model 1616. Other similar ratio transformer bridges have been made in the past by companies such as Electro Scientific Industries and Wayne Kerr. Although these bridges have accuracies as high as 0.001%, they are all antiquated by today's standards, requiring manual operation by a skilled operator, having large numbers of manually operated switches which are prone to wear and thus reliability problems, and many sources of error which can only be corrected for with some effort on the part of the operator. Obviously, the speed with which such bridges can be operated is very slow since the operator must both balance the bridge and record the measurement, a process that takes an experienced person at least a minute.

More recently, quite a number of highly automated impedance bridges have become available such as the Hewlett-Packard 4274, the GenRad 1689, the Electro Scientific Industries 5100, the Boonton 76A and the Wayne Kerr 905. While these companies make some very flexible, fast, easy to use bridges capable of measuring a wide range of parameters, the very best is rated for measuring capacitance to an accuracy of only 0.02% under ideal conditions. While these products have found many uses, their limited accuracy prevents their application in situations where only the accuracy and resolution provided by a ratio transformer bridge such as the GenRad 1615A is adequate.

One manufacturer, Tettex, does make several automatic capacitance bridges which incorporate ratio transformers of which the Model 2876 is the most advanced. However, unlike the Model 1615A, these bridges use transformers where a ratio of currents is used to balance the bridge rather than a ratio of voltages as in the Model 1615A. The Model 2876 also uses a single external capacitance standard rather than multiple internal capacitance and resistance standards like the Model 1615A. The Tettex bridges are somewhat specialized in that they are designed to operate at very high voltages but are only accurate to 0.05% at best, and thus are not quite as good in this respect as the automatic impedance bridges described above.

The technical literature currently contains very little regarding specific implementations of automatic high precision capacitance bridges. An exception to this is a recent article by Robert D. Cutkosky, "An Automatic High-Precision Audiofrequency Capacitance Bridge", IEEE Transactions on Instrumentation and Measurement, Vol. IM-34, No. 3, September 1985. The design of a modern capacitance bridge is discussed using conventional high precision techniques combined with modern digital circuitry. The construction of this bridge is quite different from and more conventional than the construction of the present invention.

SUMMARY OF THE INVENTION

It is an object of this invention to measure impedance, and particularly capacitance, to extremely high precision at an improved speed and ease of use over prior art.

It is a further object to provide devices in the form of specialized, solid state, ratio tranformer driven, multiplying digital to analog converters (hereinafter referred to as SSRTMDACs) which can help measure capacitance and loss much more rapidly, with lower cost and greater reliability and yet can do so at least as precisely as prior art.

It is a further object to develop precise calibration techniques for these SSRTMDACs.

It is another object to eliminate the need for resistance standards as a part of the bridge.

It is another object to provide a bridge of the preceding type incorporating a precision phase shifter and reference capacitors, with means to precisely calibrate said phase shifters.

It is yet another object to eliminate the need for accurate capacitance standards as a part of the bridge circuit and to substitute for them very stable capacitance standards whose values are only nominally correct, but whose values can be corrected for using a precision ratio transformer and a microprocessor.

Figure 1:
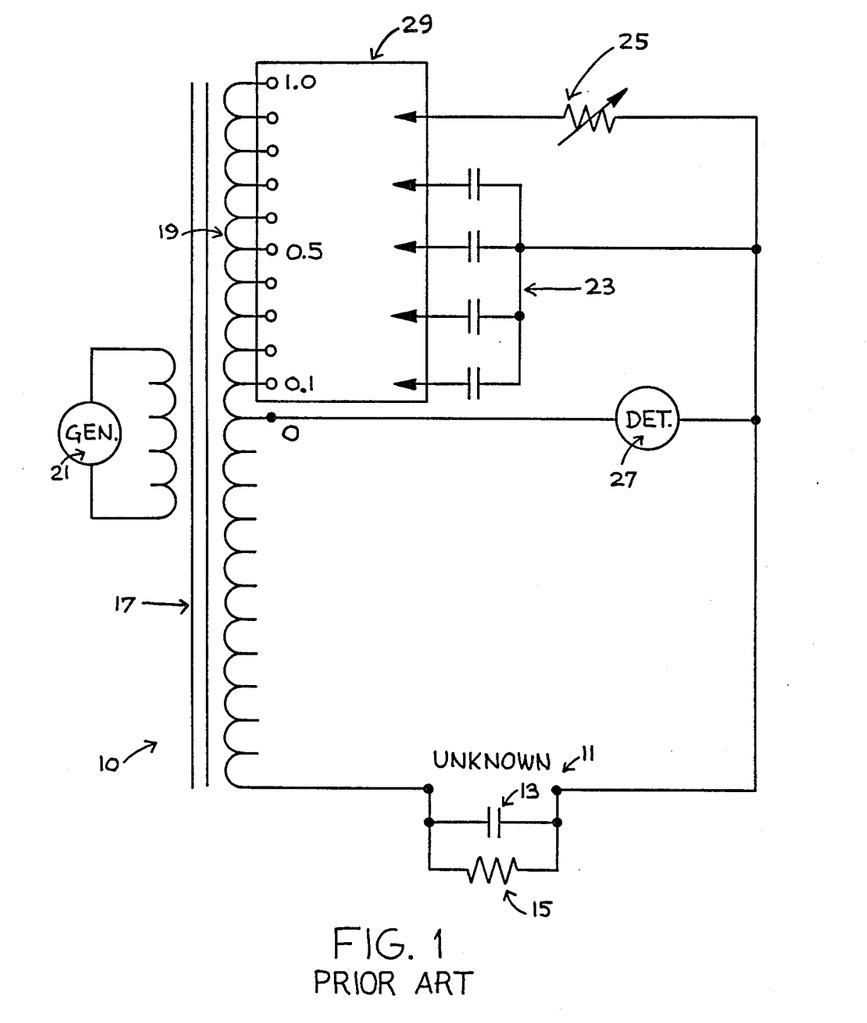
FIG. 1 is a schematic diagram of a ratio transformer bridge according to the prior art.

The foregoing objects are achieved according to the preferred embodiments of the invention by a series of enhancements to the basic bridge circuit of FIG. 1 which represents the state of the prior art. Due to the number of standard capacitors and resistors required, the bridge of FIG. 1 necessitates a large number of mechanical switches which previously have been hand operated, but for the present implementation would have to take the form of some kind of relay in order to allow them to be microprocessor controlled. Such relays are slow, expensive and less reliable than any kind of solid state switch.

An improvement to the conventional bridge provided by one aspect of this invention replaces the standard resistors and capacitors having lesser significance along with their associated switches with solid state multiplying digital to analog converters (hereinafter referred to as a SSMDAC, as opposed to the SSRTMDAC defined earlier). Relays are only used with the most significant standard resistors and capacitors (i.e. largest capacitors and smallest resistors) due to their low contact resistance and high isolation voltage. This arrangement has not been used in a high precision bridge before, although it has been used in some automatic capacitance bridges such as the GenRad 1680-A and the Tettex 2876.

An improvement over the prior art provided by another aspect of the invention involves the use of a special form of SSMDAC incorporating a ratio transformer which was referred to previously as a SSRTMDAC. This device can be constructed so as to allow its elements to be calibrated to an extremely high level of internal consistency.

The invention in its preferred form further involves the use of reference capacitors whose values are only approximately what they should be ideally, rather than precisely what they should be. Deviations of, say, 5% offer significant economics, and allow the construction of such reference capacitors to optimize characteristics such as stability which are more important than accuracy. A microprocessor can be used to correct for inaccuracies in the reference capacitors and can even determine an overall correction factor by comparison with an external standard capacitor.

Another aspect of the invention relates to the use of the precise voltage ratios provided by the ratio transformer and supported by the microprocessor to correct for errors in the ratios of the values of the internal reference capacitors and in the elements of the SSRTMDAC's.

The preferred version of the invention provides for the elimination of the resistance standards altogether in favor of a 90° phase shifter acting in conjunction with one of the SSRTMDAC's and an existing capacitance standard. This feature effectively substitutes a more perfect capacitance standard for the relatively noisy and less pure resistance standard. This may not improve the precision of the measurement of loss beyond what other techniques can provide, but it does prevent the noise and parasitics of a resistance standard from degrading the capacitance measurements.

A further feature of the preferred form of the invention provides means by which the 90° phase shifters noted above can be accurately adjusted to a gain of one and a phase shift of 90°. This is important in a precision bridge since phase shifters are not inherently precision circuits.

The preferred embodiment of the invention involves the addition of some switching which allows the two SSRTMDAC's to selectively drive one of several standard capacitors in a "sliding" arrangement. This is largely an economy measure which allows a SSRTMDAC of limited range to balance the bridge over a larger range of values than would otherwise be possible. However, it works very effectively in conjunction with the quadrature SSRTMDAC to cover a wide range of losses.

DETAILED DESCRIPTION OF THE PREFERRED EMBODIMENTS

1. Method and Apparatus to Replace Relays with Solid State Components in a Ratio Transformer Bridge FIG. 1 shows a prior art ratio transformer impedance bridge 10 designed to measure an unknown impedance 11 composed of a capacitance 13 and a loss 15. The bridge includes a voltage ratio transformer 17 which is constructed to provide very precise voltage ratios in proportion to the number of turns between its taps 19. This voltage ratio transformer (as opposed to a current ratio transformer) is also referred to herein as a "ratio transformer". The bridge is excited by a sinusoidal signal generator 21. The unknown impedance 11 is balanced against a set of known reference capacitors 23 and reference resistor(s) 25. A null voltage detector 27 is used to detect when the bridge is in a balanced state. An array of switches 29 is used to connect the appropriate standard capacitors 23 and standard resistors 25 to the appropriate taps 19 to achieve balance. The taps are shown in a decade configuration although any number base or combination thereof may be used. This bridge is a good example of the basic state of the prior art in high precision capacitance bridges such as the GenRad 1615A where the switch array 29 is controlled manually. In the present invention, described below, a similar switch array is controlled by a microprocessor.

An automatic bridge built according to the schematic in FIG. 1 would be expensive to make if not completely impractical. One reason is the large number of standard capacitors 23 and resistors 25 along with their associated relays 29 which would be involved. Since the number of standard elements and, particularly, capacitors contained in a bridge will have a significant effect on the cost of the bridge, it is important to minimize the number of these capacitors that are used. The use of relays would make it slow and relatively failure prone.

Figure 2:
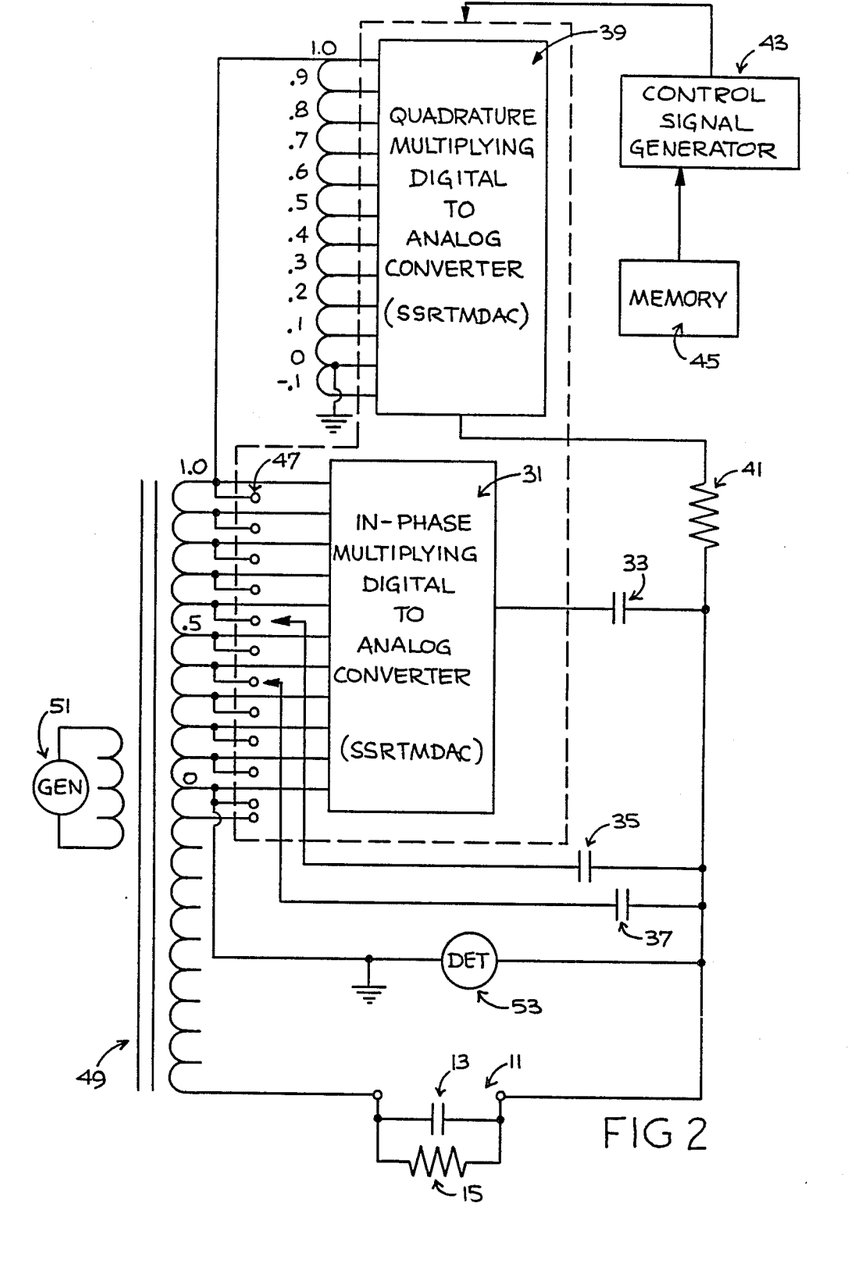
FIG. 2 is a schematic diagram of a ratio transformer bridge according to an embodiment of the invention.

FIG. 2 shows an embodiment of the present invention which is an improvement over the circuit of FIG. 1 where the many standard capacitors 23 of FIG. 1 have been replaced with only three such capacitors 33, 35, and 37. All but these three standard capacitors are replaced by a multiplying digital-to-analog converter (SSMDAC) 31 which drives a single standard capacitor 33. This converter will be referred to as the in-phase SSMDAC (or SSRTMDAC). The remaining two fixed standard capacitors 35, 37 balance the two most significant decades of the unknown capacitance 13 and must use relay switching elements as in FIG. 1 to give these two decades the greatest possible precision. The variable standard resistor(s) 25 are replaced with a second SSMDAC 39 which drives a single standard resistor 41. This SSMDAC will be referred to as the quadrature SSMDAC (or SSRTMDAC). This yields a total of four standard elements, three capacitors 33, 35, 37 and one resistor 41. This is a good choice for a bridge which is optimized to measure capacitance, but there is no reason why additional, more significant standard resistors could not be added, and even inductors are possible. Other components of the bridge of FIG. 2 include a control 43 and a memory 45 which are described below, a switch array 47 similar to array 29, a ratio tranformer 49 like ratio transformer 17, a generator 51 like generator 21, and a detector 53 like detector 27 shown in FIG. 1.

Figure 3:
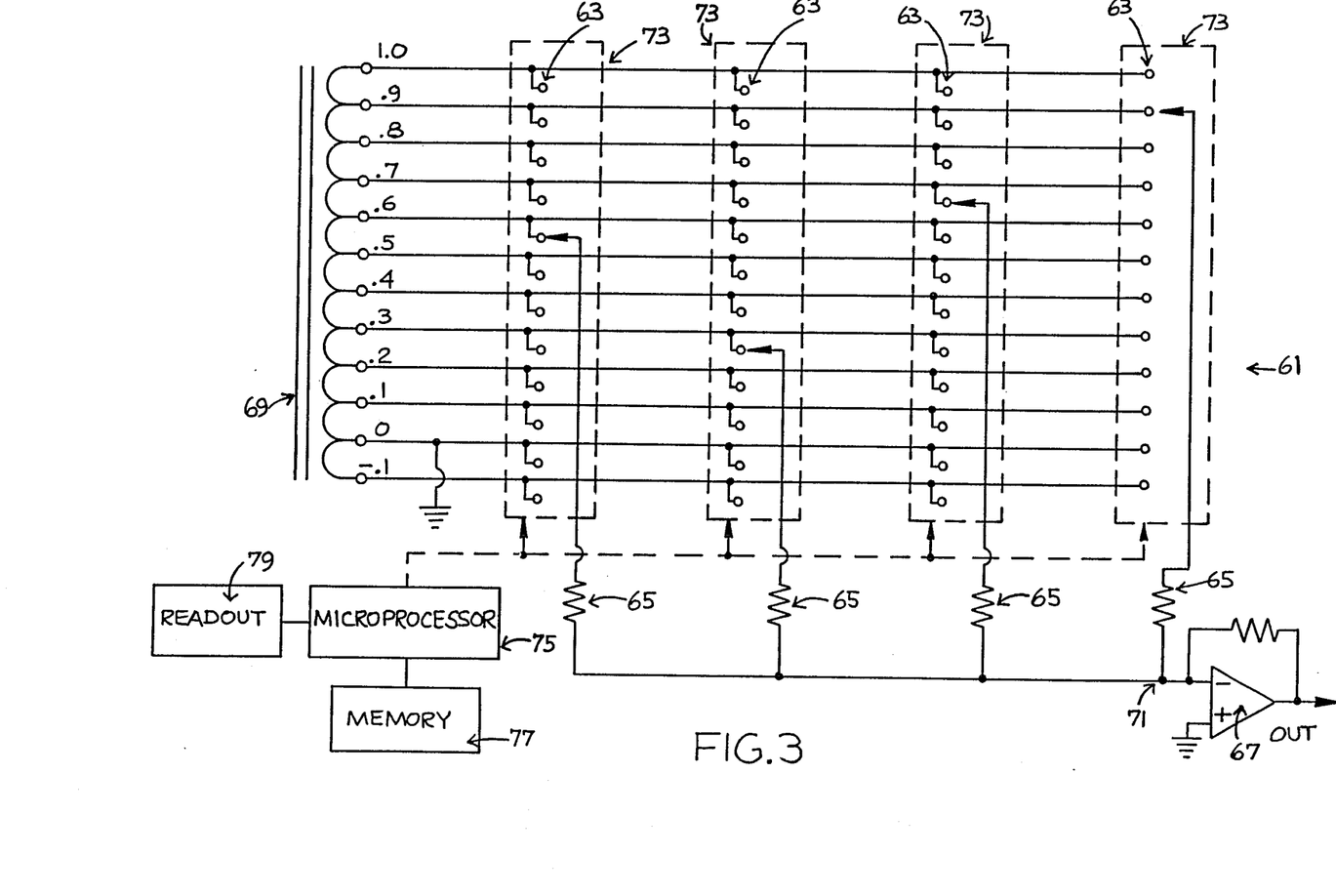
FIG. 3 shows schematically a SSRTMDAC as incorporated in the bridge of FIG. 2.

Construction of the SSMDAC's can take many forms, but a preferred unit is described herein and labeled "SSRTMDAC" and is shown in FIG. 3. The SSRTMDAC is identified by the reference numeral 61, and includes sets of switching elements 63 which are non-mechanical, preferably solid state switches, precision resistors 65 connected to switching elements 63 and an operational or summing amplifier 67. These components form a digital to analog converter having a ratio transformer 69 and a summing point 71. The precision resistors 65 and summing amplifier 67 form a summing circuit. Each of the precision resistors 65 has replaced one of the original standard capacitors 23. The resistors drive the summing point 71 of operational amplifier 67 much the way that the standard capacitors drove the summing point of the bridge in FIG. 1. The switching elements 63 are typically field effect transistors which are used for their speed, reliability and low cost. These switches may be incorporated into integrated circuit multiplexers 73 which also contain decoding and driving logic for the switches. The multiplexers select which tap of the ratio transformer 69 the resistors 65 are driven by. The multiplexers 73 are operated by a microprocessor 75 which controls the functions of the bridge. Microprocessor 75 operates in conjunction with a memory 77 and a readout 79 in a known manner. The net result is that the AC voltage at the output of the operational amplifier 67 can be set to any value with four decade resolution by the microprocessor. As with the bridge of FIG. 1, the SSRTMDAC example presented here is chosen so that each resistor 65 covers a single decade, but any number base or combination thereof may be used.

The advantage associated with using a ratio transformer as a part of a SSMDAC goes beyond that of providing more precise voltages for the summing amplifier 67 to select. The additional advantage lies in being able to precisely calibrate the entire SSRTMDAC. This will be discussed in detail later. Thus, the SSRTMDAC's eliminate the need for all but the largest standard capacitors by using precision resistors and other common circuit elements. This reduces the cost of the bridge and greatly increases its speed and reliability without sacrificing the precision of the instrument.

2. Method for Measuring the Loss Component of Impedance using a Standard Capacitor and a Phase Shifter as part of a Ratio Transformer Bridge FIGS. 1 and 2 have shown two different ratio transformer bridges which can be used to measure capacitance. In each case, the unknown capacitance is found by balancing it against a known standard capacitance. Similarly, the conventional practice is to identify an unknown loss by balancing it against a known resistance in some way. Both FIGS. 1 and 2 show a standard resistance 25, 41 which is used for this purpose.

Although the application of standard resistors to balance unknown resistances has withstood the test of roughly a century of use, there are three limitations to this basic technique. These limitations normally only become a problem when one is trying to build a capacitance bridge of the highest accuracy and resolution. The limitations are:

a. All resistors have a theoretical minimum noise voltage which appears across their terminals. This noise is commonly known as thermal or Johnson noise. Its magnitude is proportional to the resistance, the absolute temperature and the bandwidth. Due to its fundamental nature, it can not be eliminated by any degree of cleverness other than reducing the resistance, the temperature or the bandwidth to zero. Conventional practice normally is to keep these three parameters as low as is practical, but the only way to totally eliminate this noise source is to eliminate the resistance that causes it.

b. The impedance of any real resistor also has components of capacitance and inductance. Thus if a bridge were built using circuitry as simple as in the examples of FIGS. 1 and 2, it might have poor accuracy due to the extraneous capacitances that the resistors would introduce. A number of tricks can be pulled to reduce this problem to an acceptable level such as the use of a wye-delta transformation. This would use three smaller resistors to simulate one potentially very large one. Note, however, that the detector would now be shunted by a much smaller resistor which may increase the noise and decrease the sensitivity of the detector.

c. All resistors dissipate an amount of power equal to the square of the current through the resistor times the value of the resistor. This power causes the temperature of the resistor to increase which in turn causes its resistance to change by an amount which is proportional to its temperature coefficient. This can be a problem in resistors which are used as standards if it is not possible to make the current and/or the temperature coefficient small enough.

Clearly, if the loss component of the unknown impedance can somehow be balanced without actually using a resistor, then all of the above mentioned limitations inherent in the use of a resistor may be eliminated.

Figure 4:
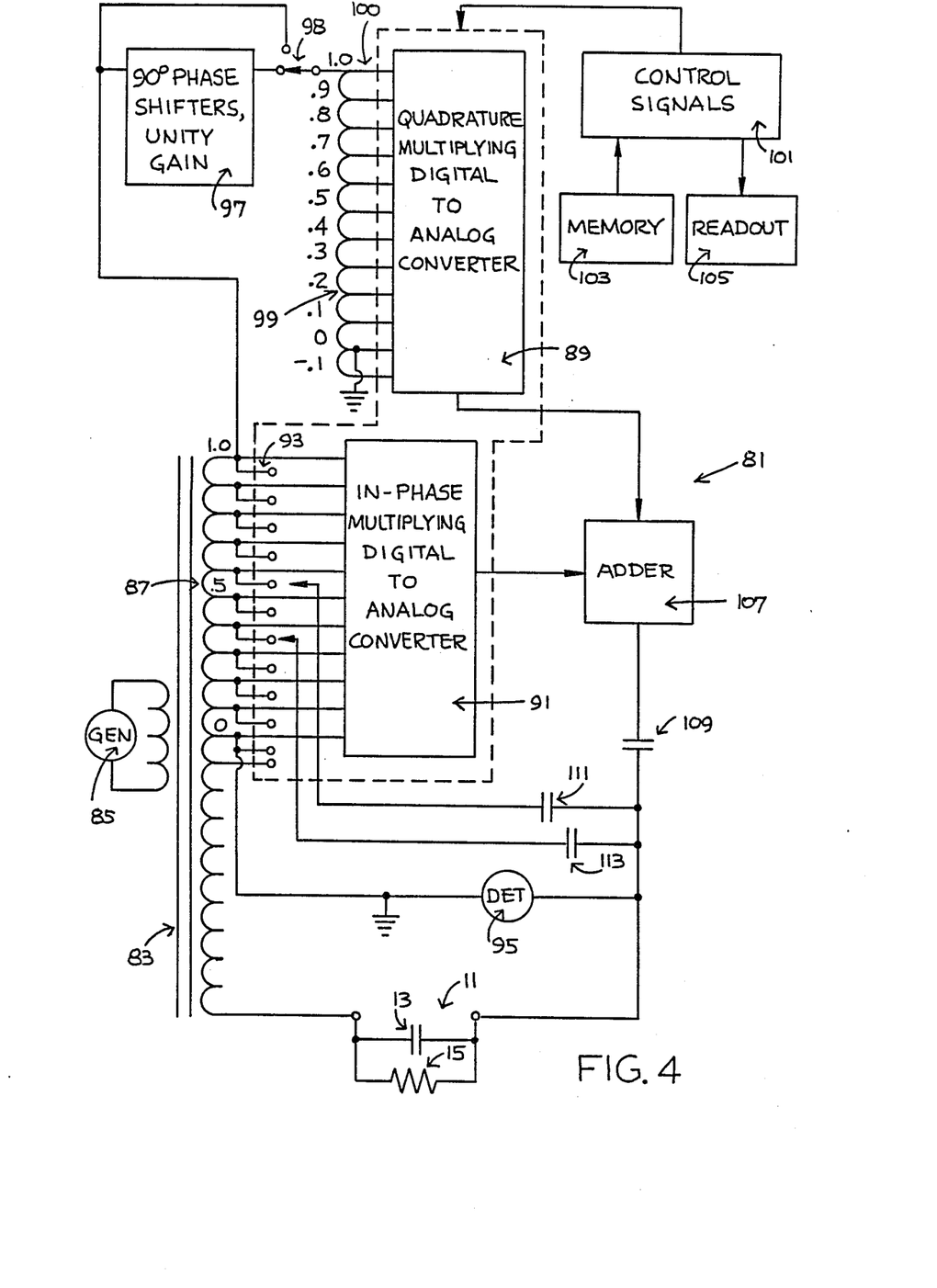
FIG. 4 is a schematic diagram of another embodiment of a ratio transformer bridge according to the invention, this bridge incorporating a phase shifter.

The present invention in a preferred form accomplishes this by replacing the standard resistor with a standard capacitor and a 90 degree phase shifter having unity gain. The basic schematic shown in FIG. 2 has been changed to reflect this new design in FIG. 4. Referring to FIG. 4, a ratio transformer bridge 81 is depicted which includes a ratio transformer 83, a generator 85, a set of taps 87, a quadrature SSRTMDAC 89, an in-phase SSRTMDAC 91, a set of relay switches 93, and a phase sensitive detector 95, all as discussed with regard to the circuitry of the preceding figures. A 90° phase shifter 97 with unity gain, is driven from a tap on the in-phase ratio transformer 87 and drives, through a switch 98, the quadrature ratio transformer 99 having taps 100 which are associated with SSRTMDAC 89. Both SSRTMDAC's are regulated by a central signal generator 101 which operates under the influence of a memory 103 and which transmits output signals to a readout 105. The outputs of SSRTMDAC 89 and of SSRTMDAC 91 are connected to an adder 107. The output of adder 107 is connected to a reference capacitor 109. Reference capacitors 111 and 113 are adjustably connected to in-phase tranformer taps 100 via relay switches 93.

In order to balance a given unknown resistance 15 by using a known capacitance, the known capacitor must have a capacitance equal to the reciprocal of the corresponding known resistor times the frequency, times $2\pi$ as is well known. With the capacitor chosen to be this value, the only difference between it and the known resistor is that the capacitor has shifted the phase by 90° and the resistor has not. Thus by adding a precise, unity gain, 90° phase shifter 97 of the opposite sign, the phase shift introduced by the standard capacitor 109 is cancelled and the combination of the two circuit elements behaves like a resistor.

The benefits to this particular configuration are first that there are no standard resistors at the input of the detector 95 to create noise there; indeed, the only resistor-induced source of noise is that in the unknown 11 itself. Secondly, the absence of standard resistors in the bridge circuit itself means that the capacitance error across them is also eliminated. Although the resistors used in the SSRTMDAC 89 also have this kind of error, the problem is greatly reduced there since these resistors have a resistance which is small in comparison to their capacitive reactance. The latter is not true in the case of resistors which would be used directly in the bridge circuit because the resistance of these resistors must be very high in order to balance the large resistances that one expects from most unknown capacitors. If a wye-delta conversion implementation is used instead, then one is still limited by the stray capacitance in both resistors that form the top of the "T".

3. Method and Apparatus for Producing an Accurate 90° Phase Shift

Using the techniques discussed above, the accuracy with which the resistive component of the unknown impedance (loss) can be measured is limited largely by the quality of the 90° phase shift. Any error in the phase angle or the gain of the phase shifter will appear as an error in the capacitance and loss measurements.

Figure 5:
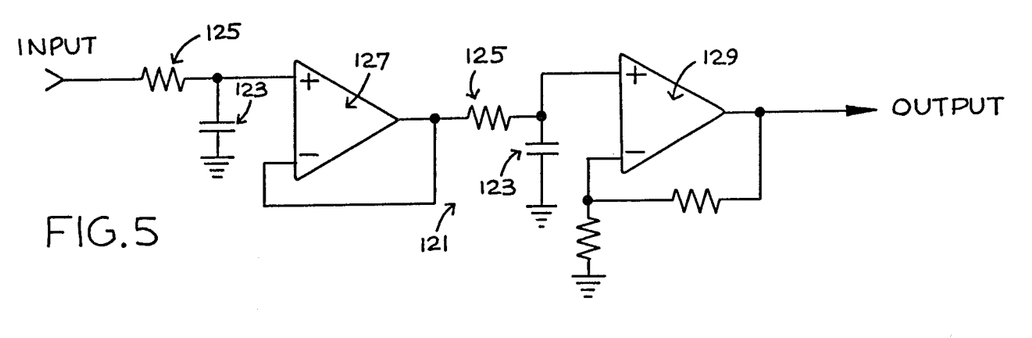
FIGS. 5 and 6 are embodiments of phase shifters pursuant to an aspect of the invention.

There are many ways to shift the phase of a sinusoidal signal. Probably the most straightforward is to use two RC networks as shown in FIG. 5. Phase shifter 121 has two RC networks which each use a capacitance 123 and a resistance 125 with gain provided by amplifiers 127 and 129. If the component values are chosen properly, this circuit will do an excellent job of shifting the phase by 90° while maintaining a unity gain. However, the quality of the result depends directly on the tolerance of the resistors and capacitors that are used. While it is possible, but expensive, to buy close-tolerance resistors, it is not practical to do as well with capacitors, since we are trying to achieve overall phase and gain errors of better than one part in ten thousand. Thus the better solution is to incorporate components which are reasonably stable, but not accurate to the desired tolerances. If adjustment means are then provided for correcting the phase and gain errors of this circuit, then the desired accuracy can be obtained economically. The circuitry and method for determining a precise 90° phase shift is the subject of this section.

Figure 6:
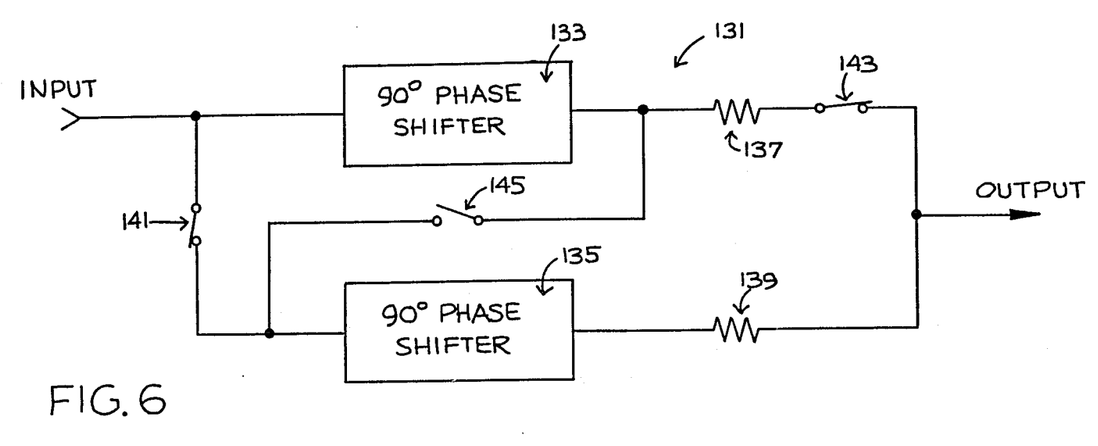

The circuit of FIG. 6 is used to adjust the internal phase shifters so that a precise 90° phase shift is obtained at the output of this circuit. FIG. 6 shows a phase shift circuit 131 which comprises 90° phase shifters 133, 135 whose outputs are connected respectively to resistors 137 and 139, and which are connectable through various lines through switches 141, 143 and 145. This circuit can be configured in two ways which we shall call "series" and "parallel". The parallel configuration occurs when switches 141 and 143 are closed and 145 is open. The series configuration has 145 closed and 141 and 143 open. The parallel arrangement is the normal operating configuration. It provides an average of the two 90° phase shifted signals at its output and in so doing, can provide much more precise phase shifts than either phase shifter 133, 135 individually when calibrated with the series arrangement.

The series arrangement is used to calibrate the overall circuit in such a way that the parallel configuration produces an accurate 90° phase shift. The signal at the output of the two 90 degree phase shifters 133, 135 in the series configuration is nominally the inversion of the input signal. Ideally, if the sum of the phase shifts from the individual phase shifters 133, 135 is 180 degrees and the net gain is unity, then the output signal will be exactly the inversion of the input. However, since the components used are not perfect, this will never be quite true. Suppose that the some kind of adjustment means is provided in one (or both) of the basic phase shifters so as to provide a way of adjusting the gain and phase of these circuits. To use this adjustment means to make the output be precisely the inversion of the input, a precision adder is needed to add the input and output signals and thus obtain a null result when inversion is achieved. One economical way to do this is by using the bridge circuitry of FIG. 4. If the in-phase 91 and quadrature 89 SSRTMDAC's are set to exactly the same value, and if there is no unknown impedance connected, then the input to the detector 95 will be zero when the output of the series phase shifter circuit 97 is precisely the inversion of its input.

To calculate the errors involved with this scheme, assume that the unity gain of one of the phase shifters is in error by an amount A, and that the phase angle is in error by the angle P radians, so that its gain is actually $1+A$ and its phase is $\pi/2+P$ radians. If the other phase shifter has been adjusted so that the series output is 180° with a gain of one, then this other phase shifter must now have a gain of $1/(1+A)$ and a phase angle of $\pi/2-P$ radians. Consequently, this adjustment procedure has established a well-defined relationship between the gains and phase angles of the two basic phase shifters.

If these two basic phase shifters are connected in parallel as in FIG. 6, the two resistors 137 and 139, will average the outputs of these phase shifters with the result appearing at the output of FIG. 6. (These resistors form a simple adder which could be implemented many other ways.) To find out how close this result is to unity gain and 90° one can mathematically average the two vectors that represent the outputs of the basic phase shifters. If the errors, A and P, are assumed to be small, then Taylor series expansions can be used to simplify the results. Performing the algebra and keeping only second-order and lower terms, the in-phase component of the resulting vector is AP and the quadrature component is $1+(A^2-P^2)/2$. Notice that all first order error terms have dropped out.

To consider some specific error examples, assume that the basic phase shifters have been previously adjusted so that A and P are both 0.01. This would produce an in-phase error component of 0.0001 and a quadrature error component of zero. This is equivalent to a phase angle error of 0.0001 radian and a gain error of zero. As a second example, assume that A is 0.01 and P is 0.005. This would produce an in-phase error component of 0.00005 and a quadrature error component of 0.0000375. This is equivalent to a phase angle error of 0.0000375 radian and a gain error of 0.00005. Clearly the circuit of FIG. 6 can be adjusted using this series/parallel technique to obtain precise unity gains and 90 degree phase shifts. Notice, however, that the closer the basic phase shifters are adjusted to unity gain and 90° phase shift, that the smaller the final error is after the series/parallel technique is applied.

The calibration method described above assumes that the error correction adjustments are made by some kind of trimmers that are built into the hardware of the circuit. These trimmers may be variable resistors which can be adjusted by hand. If such trimmers are actually digital-to-analog converters (DAC's), then the microprocessor 101 could automatically perform the calibration as often as is necessary. Unfortunately, there is a cost penalty associated with using DAC's so that a method of direct software correction could be much more cost effective. Such a method is described below.

We begin by assuming that the basic phase shifters have each been set at the factory to be as close to 90° and unity gain as is practical. Now assume that the gain of one of the basic phase shifters is $1+B$ and its phase shift is $\pi/2+Q$ radians and that for the other phase shifter, the values are $1+C$ and $\pi/2+R$ radians, respectively. Thus the gain errors are B and C, and the phase errors are Q and R.

If the phase shifters are put in the series configuration, then using algebra, one finds that the in-phase component of the output voltage is $1+B+C+BC-Q^2/2-R^2/2-QR$ to second order or simply $1+B+C$ to first order. Similarly, the quadrature component of the output voltage is $Q+R+BQ+BR+CQ+CR$ to second order or simply $Q+R$ to first order.

If the phase shifters are put in the parallel configuration, then using algebra, one finds that the in-phase component of the output voltage is $(Q+R+BQ+CR)/2$ to second order or simply $(Q+R)/2$ to first order. Similarly, the quadrature component of the output voltage is $1+(B+C)/2-Q^2/4-R^2/4$ to second order or simply $(B+C)/2$ to first order.

Referring to the basic bridge circuit in FIG. 4, if the unknown is disconnected and the phase sensitive detector 95 is implemented using an analog-to-digital converter (ADC), then the detector can be used to directly measure the in-phase and quadrature components of the output of the collective phase shifter circuitry. Now suppose the phase shifters are put in the series configuration. If the in-phase 91 and quadrature 89 SSRTMDAC's are set to exactly the same value, and if there is no unknown impedance 11 connected, then the input to the detector 95 will be zero when the output of the series phase shifter circuit 97 is precisely the inversion of its input. Any deviation from zero represents the two error components, which, from our calculation above are $B+C+BC-Q^2/2-R^2/2-QR$ for the in-phase part and $Q+R+BQ+BR+CQ+CR$ for the quadrature part. The microprocessor saves these two numbers and uses them to correct the deviations from unity gain and 90° phase shift in the parallel configuration of the phase shifter circuitry.

The actual correction is performed (using the microprocessor) by applying the saved error deviations to each component of the voltage read from the ADC when measuring an unknown impedance. Specifically, the saved in-phase error deviation is divided by 2 and subtracted from the quadrature component of the unknown impedance. Likewise, the saved quadrature error deviation is divided by 2 and subtracted from the in-phase component of the unknown impedance. Performing the algebra, one finds that the residual error in the unknown impedance is $(BR+CQ)/2$ for the in-phase component and $(QR-BC)/2$ for the quadrature component. Both of these are second order terms so that if the initial errors in the gain and phase shift are small, then the corrected errors will be very small. If the initial errors are of the order of 1% then the corrected errors will be of the order of 0.01%. Notice that the algebraic terms for these errors simplify to precisely the same terms as were obtained for the hardware series/parallel correction technique.

Another important advantage of the averaging circuit which is a part of the parallel circuit is that it need not be as precise as the phase shifted signal that it is intended to handle. To calculate the error caused by our example averaging circuit above which consisted of two nominally equal resistors 137, 139, assume that the individual phase shifters produce voltages of $V(1+\Delta)$ and $V(1-\Delta)$ and that the resistors used in the averaging circuit have a value and tolerance of $R(1\pm\delta)$. Performing the algebra, the worst case output voltage becomes $V(1+2\delta\Delta)$ if $\delta<<1$. Thus, for example, if $\delta$ and $\Delta$ both are 1% (0.01), then the worst case error in the amplitude of the output signal is 0.02% (0.0002) which is far better than the error of $\delta$.

We have indicated that in order to take advantage of the series/parallel scheme, each of the individual phase shifters 133, 135 must be adjusted so that the errors in the gain and phase of each are, roughly, less than the square root of the desired error level at the output of the parallel circuit 97. One of the easiest ways to do this is to compare the gains and phases of the two individual phase shifters 133, 135 with each other and then adjust them so that the differences between the phase shifters is zero. This will make the two phase shifters equal and in combination with the series adjustment method, will cause them each to have a gain of one and a phase shift of 90 degrees. There are many possible circuits which can accomplish this equality comparison and the one that is chosen should depend upon the level of accuracy desired. One simple approach is to connect a phase sensitive ADC separately to the output of each individual phase shifter 133, 135 while their inputs are connected to a common and constant voltage source and then adjust them until the ADC reads the same phase and gain for each. This comprises one comparison means. The accuracy would depend largely on the resolution of the ADC. An even simpler and very precise method is to connect a phase sensitive null detector between the outputs of the individual phase shifters 133, 135 with their inputs again connected to a common voltage source and adjust for zero voltage in both phases. This comprises another possible comparison means.

As we showed earlier with the series circuit arrangement, it is possible to substitute actual physical adjustment of circuit parameters with software correction by a microprocessor. In a similar manner, it is possible merely to measure the amount by which the individual phase shifters differ from equality and use the microprocessor to compensate for this differing amount rather than to actually adjust the circuit to eliminate this difference. A phase sensitive ADC connected as indicated above can easily measure the differing gain and phase between the two phase shifters to give the microprocessor the required error numbers to work with. The error mathematics are handled in the same manner as for the series circuit.

4. Replacement of Conventional High-accuracy Capacitance Standards with Inaccurate but Stable Capacitors The standard capacitors in all of the figures that we have referred to would, conventionally, have been constructed and adjusted to a high degree of accuracy to a specific predetermined value. For a decade bridge they usually would be related to each other by very precise factors of ten. The ultimate accuracy of the bridge would depend directly upon the accuracy of these standard capacitors.

There are several problems with trying to make extremely accurate capacitors (typically within the range of 0.1 to 10 ppm error). The adjustment of such capacitors to high accuracy is a difficult (and thus expensive) task with potentially imperfect results. Trimmer capacitors have been used in the past to make these adjustments, but the wider the range they cover, the more they are susceptible to stability problems themselves. A more modern standard might use metal films on a very stable substrate. Such films could be trimmed very precisely using lasers, but could not be changed in the field should the standard need recalibrating. Furthermore, neither trimmer capacitors nor laser trimming would allow zeroing the loss component of the standard's impedance. A truly high precision capacitance bridge must have either a standard with a near zero loss component or a means' of compensating for a non-zero component. Our solution to these problems is to concentrate on constructing a very stable reference capacitor while only making its actual capacitance and loss values nominally correct. Such capacitors can work very well if the bridge is designed to correct for their inaccuracies.

To demonstrate the calculations required to perform such corrections we will use the example bridge circuit shown in FIG. 4 as an example. This circuit uses three reference capacitors 113, 111 and 109 whose values are related by roughly a factor of ten. The equation which describes the balanced bridge condition may be written as a sum of complex admittances in the form:

$$Y_x = T_1 Y_1 + T_2 Y_2 + T_3 Y_3 + jT_4 Y_3 \quad (1)$$

where $Y_x$ is the admittance of the unknown sample, $Y_1$, $Y_2$, and $Y_3$ are the admittances of the reference capacitors, $T_1$, $T_2$, $T_3$, and $T_4$ are the transformer turns ratios needed to achieve balance, and j is the square root of minus one. In this example, $T_1$ and $T_2$ are explicit taps on the ratio transformer each representing only a single decade of ratio. On the other hand, $T_3$ and $T_4$ each represent multiple decades of transformer taps synthesized by a SSRTMDAC. $T_3$ is the value for the in-phase SSRTMDAC and $T_4$ is the value for the quadrature SSRTMDAC. The j indicates that the signal phase is shifted by 90° for the quadrature SSRTMDAC.

Each of these complex admittances may be expanded as:

$$Y = \frac{1}{R} + j\omega C \quad (2)$$

where R is resistance, $\omega$ is $2\pi$ times the frequency, and C is capacitance ($C_1$ is the capacitance of capacitor 113, $C_2$ that of capacitor 111, and $C_3$ that of capacitor 109). If this expansion is substituted into equation 1, and the real and imaginary parts of the equation are separated, then the unknown resistance is:

$$R_x = \frac{1}{\frac{T_1}{R_1} + \frac{T_2}{R_2} + \frac{T_3}{R_3} - T_4 \omega C_3} \quad (3)$$

and the unknown capacitance is:

$$C_x = T_1 C_1 + T_2 C_2 + T_3 C_3 + \frac{T_4}{\omega R_3} \quad (4)$$

These two equations allow one to determine the value of the unknown capacitance and resistance to high precision if the transformer turns ratios and the admittances of the reference capacitors are also known to high precision. Similar results are easily obtained for other circuits having differing numbers of reference capacitors in the in-phase and/or quadrature sections of the circuit and even for circuits using different number bases.

Although, in this example, $C_1$ has been limited to being roughly ten times $C_2$ and $C_2$ must be roughly ten times $C_3$, there are several other restrictions that must be placed upon the values of the inaccurate but stable reference capacitors if they are to function properly in a precision bridge. Since the references are expected to be of good quality, all of the R's will be very large making the first three terms of equation 3 and the fourth term of equation 4 very small. This makes the determination of the unknown capacitance in equation 4 independent of frequency to the extent that the resistance, $R_3$, of reference $C_3$ is large. This is desirable in a bridge designed to measure capacitance to very high precision since it eliminates the need to know the frequency precisely.

The second restriction on the actual values that the reference capacitors may have, is needed to ensure that the range of unknown values that the bridge can measure does not contain gaps where the bridge cannot balance the unknown impedance. This can occur if the transformer voltage sections or increments are too large relative to the ratio of the values of adjacent capacitance reference decades. More specifically, given the worst case tolerances for the reference capacitors, the voltage contribution of the nth reference capacitor when driven by only a single (smallest) voltage section from the ratio transformer, must be less than or equal to the sum of the contributions of all the lesser reference capacitors when driven by the highest available transformer voltage. If the lesser reference values are written as $C(n-1)$, $C(n-2)$, etc., then this may be expressed as:

$$\frac{FC(n)}{N} \leq fC(n-1) + fC(n-2) + fC(n-3) + \ldots \quad (5)$$

where F is an error factor which represents the greatest amount by which the nth references can exceed its nominal value $C(n)$. The error factor f, represents the greatest amount by which the values of the lesser references may fall short of their nominal values. The number of voltage increments (or sections) into which the output of the ratio transformer is divided is N.

If each decade (N-ade) of the bridge uses the same number base, then the various nominal reference values may be related by:

$$C(i) = BC(i-1) \tag{6}$$

where B is the number base, and $C(i-1)$ is the next reference value of lesser significance below $C(i)$. Combining equations 5 and 6 yields:

$$\frac{f}{F} \gtrsim \frac{1}{\left(\frac{N}{B} + \frac{N}{B^2} + \frac{N}{B^3} + \ldots\right)} \tag{7}$$

This puts a lower bound on the ratio of the allowable error factors. Although f and B have been assumed to be the same for each reference capacitor, this has been done to be able to arrive at the easily computable result of equation 7 and because most practical bridges would be designed this way. Otherwise, f and B need not be limited in this manner.

To look at some typical examples from equation 7, consider a decade bridge with a ratio transformer having ten taps so that $N=9$. This gives a lower bound for f/F of approximately 1.0 which means that the references can not deviate from their nominal value. This example applies to a conventional ratio transformer bridge having accurate standards.

If an eleventh tap is added to the previous example, then $N=10$ and the lower bound for f/F is approximately 9/10. This is equivalent to allowing the references to deviate from their nominal value by about 5%. (Actually, conventional ratio transformer bridges may have more than ten taps, but they have never been used in this manner to compensate for very inaccurate capacitance standards.)

The above discussion identified an important restriction on the actual values of the reference capacitors in the form of a lower bound for f/F. There is a remaining restriction on these values which may be thought of as providing an upper bound for f/F. However, rather than expressing this restriction in terms of an upper bound on f/F, it is much easier to express in terms of the maximum range and resolution that the bridge is to achieve. The range is limited by the actual value of the most significant reference capacitor which must be large enough to balance the largest unknown admittance that the bridge is required to measure. On the other hand, the resolution is limited by the least significant capacitor value which must be small enough to allow the bridge to measure to the desired level of resolution. Together, all the above restrictions determine how far the actual reference capacitor values can deviate from the desired nominal values while still allowing the bridge to meet all of its design goals.

If the restrictions on the actual values of the reference capacitors have been met, it is then a straightforward matter to measure these inaccurate references against an accurate standard and store these actual and now accurate values in a ROM. The microprocessor which operates the bridge then inserts these values into equations 3 and 4 (or their equivalent) to convert the stable but inaccurate numbers measured by the bridge to numbers which are truly accurate.

5. Method and Apparatus to Self-calibrate the Bridge Balancing Elements using the Ratio Transformers and a Single External Standard Capacitor as the Reference Standard Referring to the example bridge in FIG. 4, one sees that the transformer taps 87, 100 which are selectable by the SSRTMDAC's range in voltage from $-0.1$ to $+1.0$. This range goes beyond what is needed to balance an unknown impedance. For that, the taps need only cover the range from 0.0 to 0.9 or 1.0. The addition of the $-0.1$ and $+1.0$ taps allows the ratio transformers to be used to compare adjacent balancing decades of the bridge with one another. The largest reference capacitor 113, which balances the highest decade of capacitance can serve as a reference standard against which all of the smaller reference capacitors and decades of the SSRTMDAC's can be calibrated. It is the extremely high accuracy that can be obtained for the voltage ratios of the transformers that make this method of calibration so attractive. Ten to one ratios with an accuracy of one ppm are easily achieved.

To compare capacitor 113 against capacitor 111, capacitor 113 is connected to the $-0.1$ tap and capacitor 111 is connected to the 1.0 tap. The two SSRTMDAC's 89, 91 must be set to zero and no unknown impedance can be connected. Since $C_1$ is nominally 10 times $C_2$ and since precisely 10 times as much voltage of the opposite polarity is applied to $C_2$ as to $C_1$, the two voltage components measured at the phase sensitive detector 95 will be approximately zero. If this were done on a GenRad 1615A bridge, the calibration would be performed by adjusting the trimmer capacitor associated with the $C_2$ standard capacitor so as to get the minimum voltage at the detector. No provision is made to adjust for any loss in the 1615A bridge's standard capacitors. This manual adjustment of the capacitance error only, or small software compensations of less than 100 ppm represents the limit of the prior state of the art. Compensation for gross deviations of the reference capacitors from their nominal values on the order of several percent is new.

The value of the in-phase error voltage seen by the detector can be saved by the microprocessor as a measure of the capacitance error in capacitor 111 relative to capacitor 113. Likewise the value of the quadrature error voltage seen by the detector can be saved by the microprocessor as a measure of the loss error in capacitor 111 relative to capacitor 113. These error values can then be used by the microprocessor to arithmetically correct the readings of unknown impedance measurements. The immediate advantages over prior art are the elimination of trimmer capacitor hardware and the ability to correct the loss error as well as the capacitance error. No additional hardware is required over prior art implementations other than the use of an ADC as a part of the detector, but this ADC performs many other functions as well.

A further capability which this method allows, becomes available when the error voltage exceeds the range of the ADC. In this case, the in-phase and/or quadrature SSRTMDAC's can be set to cancel the error voltage to a level such that the remainder falls within the range of the ADC. The in-phase correction value that the microprocessor stores is then a combination of the in-phase SSRTMDAC setting and the in-phase component of the ADC. The quadrature value is handled in the same manner. Thus the size of the error in the reference capacitor which can be corrected for is limited only by the considerations discussed in section 4.

So far, we have only described how this correction technique can be used to compensate for errors in the reference capacitors. The method need not stop with the reference capacitors; it can be extended downward, decade by decade through all the decades of the capacitance SSRTMDAC. The technique is precisely the same, but the errors being corrected for are now the flaws in most of the components in the SSRTMDAC and the adder. Some of these are the errors in the resistor values, the stray capacitance across the SSRTMDAC resistors and the series "on" resistance of the SSRTMDAC switching elements. As before, each of these errors has two components so that they may easily be thought of as vectors. This is a very powerful technique since it allows an inexpensive SSRTMDAC to operate at nearly the precision of a ratio transformer/relay configuration without the corresponding speed and reliability limitations.

We would like to be able to calibrate the loss SSRTMDAC in the same manner as the capacitance SSRTMDAC, but since the output of the loss SSRTMDAC is normally phase shifted by 90°, a self-comparison cannot be made in the normal mode of operation. For this reason, FIG. 4 shows switch 98 which allows the loss SSRTMDAC 89 to be switched from its normal phase shifted mode of operation to a test mode which operates at the same phase as the in-phase SSRTMDAC 91. In fact, when the loss SSRTMDAC is in test mode, its behavior is indistinguishable from that of the in-phase SSRTMDAC and hence calibration values for it can be obtained in precisely the same manner as for the in-phase SSRTMDAC. This is very significant, because the ultimate calibration reference for both SSRTMDAC's is capacitor 113. Prior art would have employed a separate resistance standard solely for the purpose of calibrating the loss SSRTMDAC. The technique of the present invention has, instead, a single, ultra-stable, temperature controlled capacitor as the ultimate reference for both capacitance and loss.

6. Method and Apparatus for Changing Capacitance and Loss Ranges by Sliding the SSRTMDAC's along the Reference Capacitors The ultimate limitation on the precision with which the capacitance portion of the unknown impedance can be measured is determined by the quality of the ratio transformer and the reference capacitors. The basic nature of these components is such that capacitance measurements can easily be made to a precision of roughly one ppm and with difficulty to several parts per hundred million.

If the method described in section 2 is used, the loss portion of the unknown impedance can be measured to a precision of roughly one part in ten thousand. The limiting factor here is the precision of the 90° phase shifter 97. The latter is composed of ordinary semiconductors, resistors and capacitors and thus tends to be limited to their inherent precision.

Figure 7:
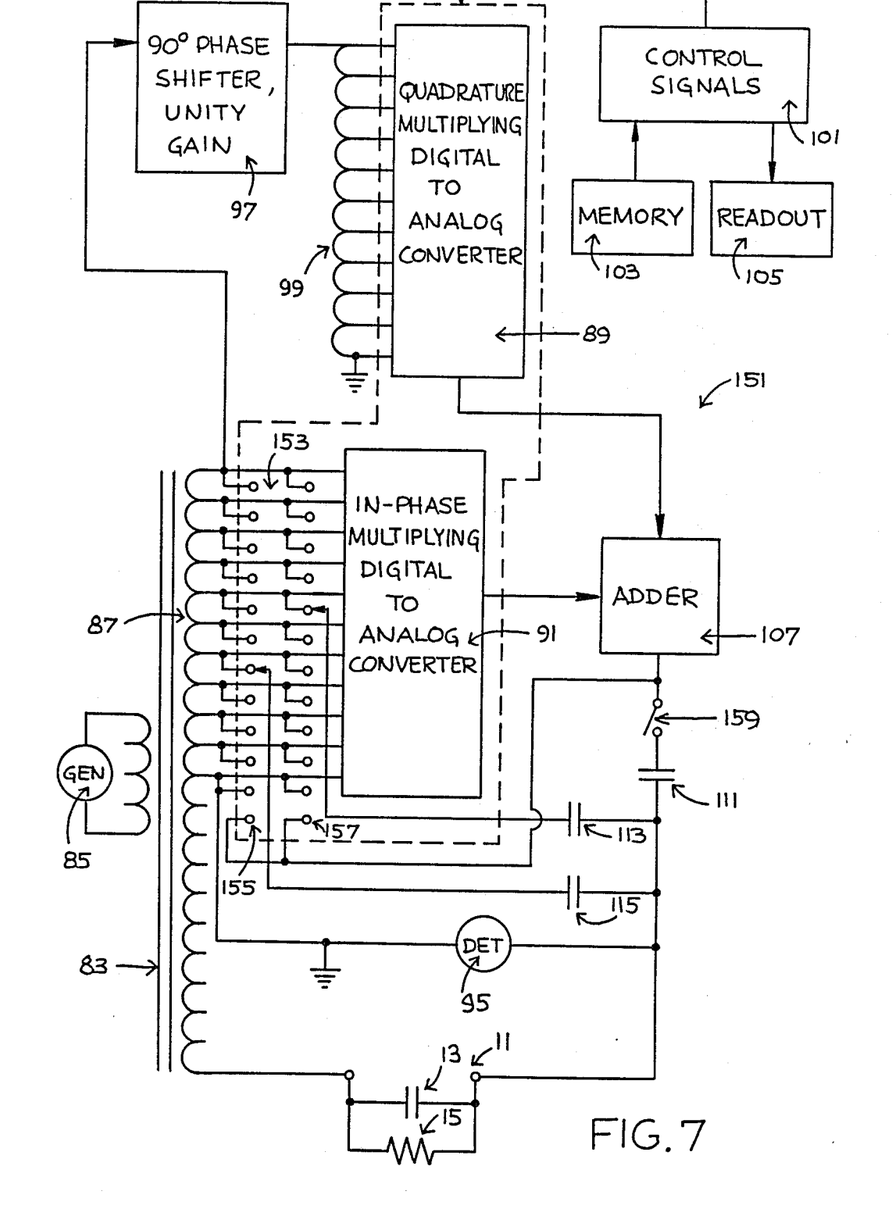
FIG. 7 is a schematic diagram of another ratio transformer bridge according to the invention.

Since the phase shifter is such a limitation, it does not make sense economically to construct more decades of precision into the quadrature SSRTMDAC 89 than exist in the phase shifter. Instead, it is preferably to allow the sum of both SSRTMDAC's to be connected in a sliding manner to the standard capacitors as shown in FIG. 7. This allows the quadrature circuitry to cover a range of loss that is as wide as the capacitance range without providing more resolution than is meaningful.

FIG. 7 illustrates a ratio transformer bridge 151 which is similar to bridge 81 of FIG. 4; therefore, like components of bridge 151 have been ascribed the reference numerals of their counterparts in FIG. 4. Bridge 151 has a bank relay switch 153 which replaces relays 93. Bank relay switch 153 is identical to relays 93 except for being drawn to explicitly show the two decades of contacts and for having additional contacts 155, 157, one for each decade. These contacts 155, 157 along with switch 159 allow the output of the adder 107 to be switched to any one of the three reference capacitors 115, 113, 111.

The example in FIG. 7 allows three different sliding positions. The lowest range of loss is obtained with switch 159 closed, the middle range with switch 157 closed and the highest range with swtich 155 closed. In each case the resolution of the loss is limited to that of the quadrature SSRTMDAC. When one switch is closed, the others are open.

Since the in-phase SSRTMDAC goes through the adder 107, it is effectively tied to the quadrature SSRTMDAC 89 and slides with it. However, the range of capacitance is not affected, because the reference capacitors at and above the current sliding position are always available for use. The resolution of the capacitance does decrease as the adder slides up to larger reference capacitors. When the adder is connected to the largest reference capacitor, the capacitance and loss resolutions are the same.

A similar means of implementing this technique would be to eliminate the adder and run each SSRTMDAC to its own set of reference capacitors. This would allow the two SSRTMDAC's to slide independently of each other. While this more flexible solution may seem to be more desirable, it is in fact only more expensive. The problem is that, unless the SSRTMDAC's are over-designed, they cannot work at different sliding positions. The errors in the SSRTMDAC at the more significant sliding position will overwhelm the settings of the least significant decades of the other SSRTMDAC. Thus little if any overall benefit is gained.

The invention has been described in detail with particular emphasis on the preferred embodiments, but it should be understood that variations and modifications within the spirit and scope of the invention may occur to those skilled in the art to which the invention pertains.

We claim:

1. A ratio transformer bridge comprising:
 a circuit for balancing the resistive component of an unknown impedance, said circuit comprising:
 voltage ratio transformer means;
 90 degree phase shifter means comprising an output terminal connected to energize said ratio transformer means;
 reference capacitor means for providing at least one known value of capacitance; and
 means for adjusting the amplitude of the signal jointly produced by the 90 degree phase shifter means and the reference capacitor means to generate a signal which balances a signal from the resistive component of the unknown impedance.

2. The bridge according to claim 1 wherein said adjusting means includes SSRTMDAC means.

3. A ratio transformer bridge comprising:
 a circuit for balancing the resistive component of an unknown impedance, said circuit comprising:
 a voltage ratio transformer;
 90 degree phase shifter means comprising:
 a first 90 degree phase shifter;
 a second 90 degree phase shifter;

an adder circuit comprising a plurality of inputs and an output;

means for connecting the input of said first 90 degree phase shifter to said ratio transformer;

means for selectively connecting the output of said first 90 degree phase shifter to the input of said second 90 degree phase shifter; means for connecting the output of said second 90 degree phase shifter to one input of said adder circuit, and means for selectively connecting said ratio transformer to another input of said adder circuit;

at least one of said 90 degree phase shifters comprising means for adjusting phase shift and gain thereof;

phase sensitive detector means connected to the output of said adder circuit for providing a null indication if the sum of the phase shifts of said first and said second phase shifters is equal to 180 degrees, and the product of the gains of said first and second phase shifters is equal to a predetermined value; and means for controlling said means for adjusting to achieve an optimum null indication by said detector means;

reference capacitor means for providing at least one known value of capacitance; and means for adjusting the amplitude of the signal jointly produced by the 90 degree phase shifter means and the reference capacitor means to generate a signal to balance the bridge against a signal from the loss component of the unknown impedance.

4. A bridge for balancing an unknown impedance, said bridge comprising:

ratio transformer means having a number of voltage divisions and a number of taps corresponding to the divisions, SSMDAC means comprising a plurality of inputs and means for selectively connecting said inputs to said ratio transformer means;

a set of reference capacitors having a range of capacitance values; and switching means for selectively connecting one or more capacitors of said set of capacitors to the output of said SSMDAC;

said SSMDAC means comprises:

first SSMDAC means connected to said ratio transformer means for generating an in-phase output;

second SSMDAC means;

90 degree phase shifter means connected to said second SSMDAC means, said second SSMDAC means generating a quadrature output signal; and adder means connected to said first and second SSMDAC means for receiving said in-phase and said quadrature output signals and for generating an output that is the sum of these outputs.

5. A ratio transformer bridge comprising:

a SSRTMDAC comprising:

a voltage ratio transformer comprising: a reference terminal, a plurality of ordered positive terminals that provide signals of a first polarity with respect to said reference terminal, and at least one negative terminal that provides signals of a polarity opposite to said first polarity;

a summing circuit comprising:

a plurality of input terminals;

a summing point terminal;

an output terminal;

a corresponding plurality of resistors coupled respectively between said input terminals and said summing point terminal; and an operational amplifier comprising: an amplifier input terminal coupled to said summing point terminal and further comprising an amplifier output terminal coupled to said summing circuit output terminal; and switching means for selectively and individually connecting each of said input terminals to said reference terminal, to said positive terminals and to a negative terminal of said ratio transformer;

means for energizing said ratio transformer;

reference capacitor means;

a detector circuit comprising: a first detector terminal coupled to a common terminal of said reference capacitor means; and a second detector terminal coupled to said reference terminal;

means for coupling said output terminal to another terminal of said reference capacitor means;

first and second unknown terminals for selective connection to a device under test;

means responsive to output signals of said detector circuit for generating signals for controlling said switching means;

means for selectively measuring parameters of operation of said SSRTMDAC;

means for storing indicia representative of said measured parameters; and means responsive to the states of the switches of said switching means and to stored data and said indicia for calculating the value of the device under test.

6. The ratio transformer bridge in accordance with claim 5 wherein:

said bridge further comprises: memory means;

the parameters of operation between one of said input terminals and said output terminal are accurately defined by data stored in said memory means; and said means for selectively measuring parameters of said SSRTMDAC measures the parameters of operation between another of said input terminals and said output terminal relative to the parameters of operation between said one input terminal and said output terminal.

7. The ratio transformer bridge in accordance with claim 6 wherein:

said means for measuring parameters of operation of said SSRTMDAC controls said switching means to:

couple said one input terminal to one of said ratio transformer terminals of a first polarity;

selectively connect another of said input terminals to a ratio tranformer terminal of opposite polarity to reduce the input signal to said detector; and selectively connect others of said input terminals to ratio transformer terminals to further reduce said input signal to said detector.

8. The ratio transformer bridge in accordance with claim 5 wherein:

said reference capacitor means comprises a plurality of reference capacitors each having first and second terminals; the first terminals of said plurality of capacitors connected to said common terminal; and said bridge further comprises second switching means for selectively connecting the second terminals to terminals of said ratio transformer.

9. The ratio transformer bridge in accordance with claim 8 wherein:

the value of one of said reference capacitors is accurately defined by data stored in memory; and wherein said bridge comprises means for measuring and storing the ratios of the values of the others of said reference capacitors to said one capacitor.

10. The ratio transformer bridge in accordance with claim 5 wherein:
said means for measuring and said means for calculating comprise a program controlled processor.

11. A ratio transformer bridge comprising:
an in-phase SSRTMDAC;
a quadrature phase SSRTMDAC;
each SSRTMDAC comprising:
a voltage ratio transformer comprising: a reference terminal, a plurality of ordered positive terminals that provide signals of a first polarity with respect to said reference terminal, and at least one negative terminal that provides signals of a polarity opposite to said first polarity;
a summing circuit comprising:
a plurality of input terminals;
an output terminal; and
a corresponding plurality of resistors respectively coupled between said input terminals and said output terminal; and
switching means for selectively and individually connecting each of said input terminals to said reference terminal, to said plurality of positive terminals and to a negative terminal of said ratio transformer;
means for energizing the ratio transformer of said in-phase SSRTMDAC with an in-phase signal;
means for energizing the ratio transformer of said quadrature phase SSRTMDAC with a signal having a phase differing from the phase of said in-phase signal by essentially 90 degrees;
reference capacitor means;
means for coupling said output terminals of said in-phase and said quadrature phase SSRTMDAC's to said reference capacitor means;
a phase sensitive detector circuit comprising a first detector terminal coupled to a common terminal of said reference capacitor means and a second detector terminal coupled to said reference terminal;
first and second unknown terminals for selective connection to a device under test; said first unknown terminal connected to a negative terminal of said ratio transformer of said in-phase SSRTMDAC and said second unknown terminal coupled to said first detector terminal;
means responsive to output signals of said detector circuit for generating signals for controlling said switching means;
means for calculating the value of the device under test.

12. The ratio transformer bridge in accordance with claim 11 wherein: said means for energizing said ratio transformer means of said quadrature phase SSRTMDAC comprises: 90 degree phase shifting circuit means.

13. The ratio transformer bridge in accordance with claim 11 wherein: said 90 degree phase shifting circuit means electrically couples a terminal of the in-phase ratio transformer to a terminal of the quadrature phase ratio transformer.

14. The ratio transformer bridge in accordance with claim 11 wherein: said means for coupling said output terminals to said reference capacitor means comprises an adder circuit.

15. The ratio transformer bridge in accordance with claim 11 wherein said ratio transformer bridge further comprises:
means for measuring parameters of operation of said SSRTMDAC's;
means for storing indicia representative of said measured parameters of said SSRTMDAC's; and
wherein said means for calculating utilizes said stored measured parameters of said SSRTMDAC's in calculating the value of a device under test.

16. The ratio transformer bridge in accordance with claim 11 wherein:
said reference capacitor means comprises: a plurality of reference capacitors and switching means for selecting a reference capacitor from said plurality of reference capacitors.

17. The ratio transformer bridge in accordance with claim 11 wherein: said reference capacitor means comprises: a plurality of reference capacitors; and said ratio transformer bridge further comprises switching means for selectively connecting a terminal other than said common terminal of certain of said reference capacitors to terminals of said ratio transformer of said in-phase SSRTMDAC.

18. The ratio transformer bridge in accordance with claim 11 wherein:
said means for energizing said SSRTMDAC's comprises:
means for selectively energizing both said SSRTMDAC's with signals having the same phase; and
means for selectively energizing one of said SSRTMDAC's with a signal that is phase shifted from the signal that energizes the other of said SSRTMDAC's.

19. A ratio transformer bridge comprising:
an in-phase SSRTMDAC;
a quadrature phase SSRTMDAC;
each SSRTMDAC comprising:
a voltage ratio transformer comprising: a reference terminal, a plurality of positive terminals that provide signals of a first polarity with respect to said reference terminal, and at least one negative terminal that provides signals of a polarity opposite to said first polarity;
a summing circuit comprising: a plurality of input terminals and an output terminal, said summing circuit providing a fixed discrete gain from an essentially ordered range of gains between each input terminal and said output terminal; and
first switching means for selectively connecting said input terminals to said ratio transformer terminals;
means for energizing the ratio transformer of said in-phase SSRTMDAC; 90 degree phase shifting circuit means for energizing the ratio transformer of said quadrature phase SSRTMDAC; said 90 degree phase shifting circuit means comprises: first and second 90 degree phase shifters and second switching means for selectively connecting said phase shifters in series to form a calibration mode and in parallel with one and another to form a normal mode;
reference capacitor means;
means for coupling said output terminals to said reference capacitor means;
a phase sensitive detector circuit comprising a first detector terminal coupled to a common terminal of said reference capacitor means and a second detector terminal coupled to said reference terminal;

first and second unknown terminals for selective connection to a device under test; said first unknown terminal connected to a negative terminal of said ratio transformer of said in-phase SSRTMDAC and said second unknown terminal coupled to said first detector terminal;

means responsive to output signals of said detector circuit for generating signals for controlling said first switching means;

means for calculating the value of the device under test.

20. The ratio transformer bridge in accordance with claim 19 wherein said ratio transformer bridge further comprises:

means for controlling said second switching means to connect said phase shifters in the calibration mode; and means for selectively measuring parameters of operation of said 90 degree phase shifting circuit means;

means for storing indicia representative of said measured parameters; and wherein said means for calculating utilizes said stored parameter indicia in calculating the value of the device under test.

21. The ratio transformer bridge in accordance with claim 20 wherein:

said means for calculating and said means for measuring comprise a program controlled processor.

22. The ratio transformer bridge in accordance with claim 19 wherein:

at least one of said phase shifters is adjustable; and wherein the ratio transformer bridge further comprises:

means for selectively measuring parameters of operation of said 90 degree phase shifters when said phase shifters are in said calibration mode;

means for adjusting said adjustable 90 degree phase shifter in accordance with said measured parameters; and means for storing indicia representative of said measured parameters.

23. The ratio transformer bridge in accordance with claim 19 wherein said series connection comprises:

an input to said first 90 degree phase shifter which serves as an input to said series connected circuit;

an output from said first 90 degree phase shifter which is connected to the input of said second 90 degree phase shifter;

an output from said second 90 degree phase shifter which serves as an output from said series connected circuit.

24. The ratio transformer bridge in accordance with claim 19 wherein said parallel coupling comprises:

switching means for connecting the inputs of both of said phase shifters together, said inputs serving as the input for said parallel connected circuit;

switching means for connecting the output of one phase shifter to one input of said adder circuit and for connecting the output of the second phase shifter to the other input of said adder circuit;

the output from said adder circuit serving as an output from said parallel connected circuit.

25. A ratio transformer bridge for balancing an unknown impedance, said bridge comprising:

first balancing means for generating an in-phase balancing signal comprising: a first voltage ratio transformer, in input terminal and an output terminal;

second balancing means for generating a quadrature phase balancing signal comprising: a second voltage ratio transformer, an input terminal and an output terminal;

means for generating first and second energizing signals for energizing said first and said second ratio transformers;

the phase of said second energizing signal differing from the phase of said first energizing signal by essentially 90 degrees;

reference capacitor means;

means for coupling said output terminals to one terminal of said reference capacitor means;

a detector circuit comprising a first detector terminal coupled to a second terminal of said reference capacitor means and a second detector terminal coupled to a reference terminal;

first and second unknown terminals for selective connection to a device under test;

means responsive to output signals of said detector circuit for generating signals for controlling said first and second balancing means; and means for calculating the value of the device under test.

26. The ratio transformer bridge in accordance with claim 25 wherein:

at least one of said first and said second balancing means comprises an SSRTMDAC means.

27. The ratio transformer bridge in accordance with claim 26 wherein:

said SSRTMDAC means includes the ratio transformer of said at least one balancing means, said last mentioned ratio transformer comprising:

a plurality of terminals and a reference terminal;

a summing circuit comprising a plurality of input terminals and an output terminal, said summing circuit providing a fixed discrete gain in a substantially ordered range of gains between each summing circuit input terminal and said summing circuit output terminal; and switching means for selectively and individually connecting said summing circuit input terminals to said ratio transformer terminals.

28. The ratio transformer bridge in accordance with claim 25 wherein:

said means for energizing said second ratio transformer means comprises: 90 degree phase shifting circuit means.

29. The ratio transformer bridge in accordance with claim 25 wherein:

said means for coupling said output terminals to one terminal of said reference capacitor means comprises an adder circuit.

30. The ratio transformer bridge in accordance with claim 25 wherein said bridge further comprises:

means for measuring parameters of operation of said balancing means;

means for storing indicia representative of said measured parameters; and wherein said means for calculating utilizes said stored indicia in calculating the value of the device under test.

31. A ratio transformer bridge for balancing an unknown impedance, said bridge comprising:

first balancing means for generating an in-phase balancing signal comprising an input terminal and an output terminal;

second balancing means for generating a quadrature phase balancing signal comprising an input terminal and an output terminal;

means for energizing said first balancing means;

90 degree phase shifting circuit means for energizing said second balancing means comprising:

two 90 degree phase shifting circuits and switching means for selectively connecting said phase shifting circuits in series to form a calibration mode and in parallel with one and another to form a normal mode;

reference capacitor means;

means for coupling said output terminals to one terminal of said reference capacitor means;

a detector circuit comprising a first detector terminal coupled to a second terminal of said reference capacitor means and a second detector terminal coupled to a reference terminal;

first and second unknown terminals for selective connection to a device under test;

means responsive to output signals of said detector circuit for generating signals for controlling said first and second balancing means; and means for calculating the value of the device under test.

32. The ratio transformer bridge in accordance with claim 31 wherein said bridge further comprises:

means for selectively measuring parameters of operation of said 90 degree phase shifting circuits;

means for storing indicia representative of said measured parameters; and wherein said means for calculating utilizes said stored indicia in calculating the value of the device under test.

* * * * *